United States Patent
Ahn et al.

(10) Patent No.: US 6,962,876 B2
(45) Date of Patent: Nov. 8, 2005

(54) METHOD FOR FORMING A LOW-K DIELECTRIC LAYER FOR A SEMICONDUCTOR DEVICE

(75) Inventors: Jae-Young Ahn, Seongnam-si (KR); Jin-Gyun Kim, Yongin-si (KR); Hee-Seok Kim, Seongnam-si (KR); Jin-Tae No, Suwon-si (KR); Sang-Ryol Yang, Suwon-si (KR); Sung-Hae Lee, Suwon-si (KR); Hong-Suk Kim, Yongin-si (KR); Ju-Wan Lim, Seoul (KR); Young-Seok Kim, Suwon-si (KR); Yong-Woo Hyung, Suwon-si (KR); Man-Sug Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/981,731

(22) Filed: Nov. 5, 2004

(65) Prior Publication Data

US 2005/0148201 A1    Jul. 7, 2005

Related U.S. Application Data

(63) Continuation-in-part of application No. 10/378,681, filed on Mar. 5, 2003, now Pat. No. 6,815,350.

(30) Foreign Application Priority Data

Mar. 5, 2002    (KR) ............................... 2002-11671

(51) Int. Cl.$^7$ ...................... H01L 21/44; H01L 21/31; H01L 21/469

(52) U.S. Cl. ............. 438/680; 438/788; 438/791; 438/792

(58) Field of Search ............................. 438/680, 788, 438/791, 792; 427/585, 255.28

(56) References Cited

U.S. PATENT DOCUMENTS

| | | | | |
|---|---|---|---|---|
| 5,605,871 A | * | 2/1997 | Baldus et al. | 501/96.4 |
| 6,794,755 B2 | * | 9/2004 | Maiz et al. | 257/758 |
| 6,815,350 B2 | * | 11/2004 | Kim et al. | 438/680 |
| 2003/0082296 A1 | | 5/2003 | Elers | 427/98 |
| 2004/0056366 A1 | * | 3/2004 | Maiz et al. | 257/779 |

* cited by examiner

Primary Examiner—Jennifer M. Kennedy
(74) Attorney, Agent, or Firm—Lee & Morse P.C.

(57) ABSTRACT

A method for forming a low-k dielectric layer for a semiconductor device using an ALD process including (a) forming predetermined interconnection patterns on a semiconductor substrate, (b) supplying a first and a second reactive material to a chamber having the substrate therein, thereby adsorbing the first and second reactive materials on a surface of the substrate, (c) supplying a first gas to the chamber to purge the first and second reactive materials that remain unreacted, (d) supplying a third reactive material to the chamber, thereby causing a reaction between the first and second materials and the third reactive material to form a monolayer, (e) supplying a second gas to the chamber to purge the third reactive material that remains unreacted in the chamber and a byproduct; and (f) repeating (b) through (e) a predetermined number of times to form a SiBN ternary layer having a predetermined thickness on the substrate.

17 Claims, 5 Drawing Sheets

METHOD FOR FORMING A LOW-K DIELECTRIC LAYER FOR A SEMICONDUCTOR DEVICE

This application is a continuation-in-part of application Ser. No. 10/378,681, filed Mar. 5, 2003 now U.S. Pat. No. 6,815,350.

BACKGROUND OF THE INVENTION

1. Field of the Invention

The present invention relates to a method for forming a low-k dielectric layer for a semiconductor device. More particularly, the present invention relates to a method for forming a ternary silicon boron nitride (SiBN) layer having a low dielectric constant using an atomic layer deposition (ALD) process.

2. Description of the Related Art

Conventionally, a silicon nitride layer ($SiN_x$) has been widely used in the manufacturing of semiconductor devices for several reasons. First, a $SiN_x$ layer has a high etching selectivity over a silicon oxide ($SiO_2$) layer in a reactive ion etching (RIE) process and a wet etching process. Second, a $SiN_x$ layer exhibits strong oxidation and abrasion resistances. Third, a $SiN_x$ layer has an excellent diffusion barrier characteristic. However, a $SiN_x$ layer has a high dielectric constant of about 7. This high dielectric constant causes a propagation delay since parasitic capacitance increases as a chip size is reduced.

Recently, in view of the above disadvantage of a $SiN_x$ layer, the $SiN_x$ layer has been replaced with a boron nitride (BN) layer having a relatively low dielectric constant as a dielectric layer for a semiconductor device. The BN layer is formed by an ALD process at a low temperature in a range of 200° C. to 550° C., so that a conformal BN layer is formed.

The BN layer formed using the ALD process has a low dielectric constant, between 2.2 and 5 depending on deposition conditions, thereby reducing the propagation delay in comparison with a $SiN_x$ layer having a dielectric constant of about 7.

However, an ALD BN layer has several disadvantages. For example, an ALD BN layer is easily hydrolyzed by moisture in the atmosphere, is wet etched by a high temperature wet chemical based on sulfuric acid $H_2SO_4$, and has poor oxidation resistance.

Further, a conventional SiBN layer formed by a plasma enhanced chemical vapor deposition (PECVD) process has poor step coverage.

SUMMARY OF THE INVENTION

The present invention is therefore directed to a method for forming a low-k dielectric layer for a semiconductor device, which substantially overcomes one or more problems due to the limitations and disadvantages of the related art.

It is a feature of an embodiment of the present invention to provide a method for forming a SiBN dielectric layer between interconnections in a semiconductor device using an atomic layer deposition (ALD) process, wherein the SiBN dielectric layer may be formed of thin films.

It is another feature of an embodiment of the present invention to provide a method for forming a SiBN dielectric layer having excellent step coverage and uniformity in thickness over an entire surface of a wafer using an atomic layer deposition (ALD) process.

It is still another feature of an embodiment of the present invention to provide a method for forming a SiBN dielectric layer having a low dielectric constant and a low etching rate over a high temperature wet chemical.

It is yet another feature of an embodiment of the present invention to provide a method for forming a SiBN dielectric layer having an excellent reactive ion etching (RIE) characteristic.

At least one of the above features and other advantages may be provided by a method for forming a low-k dielectric layer for a semiconductor device using an atomic layer deposition (ALD) process including (a) forming predetermined interconnection patterns on a semiconductor substrate, (b) supplying a first reactive material and a second reactive material to a chamber having the substrate therein, thereby adsorbing the first reactive material and the second reactive material on a surface of the substrate, (c) supplying a first gas to the chamber to purge the first reactive material and the second reactive material that remain unreacted, (d) supplying a third reactive material to the chamber, thereby causing a reaction between the first and second materials and the third reactive material to form a monolayer, (e) supplying a second gas to the chamber to purge the third reactive material that remains unreacted in the chamber and a byproduct, and (f) repeating (b) through (e) for forming the monolayer a predetermined number of times to form a SiBN ternary layer having a predetermined thickness on the substrate.

In the method, forming the predetermined interconnection patterns on the substrate may include forming a tunnel insulating layer on the substrate and sequentially forming a floating gate, a gate interlayer dielectric layer, and a control gate on the tunnel insulating layer.

Forming the predetermined interconnection patterns on the substrate may include forming a bit line.

The method may further include etching the SiBN ternary layer to form spacers on sidewalls of the floating gate and the control gate.

The first reactive material may include $BCl_3$, $BBr_3$, $B_2H_6$ or $BF_3$ gas and may be supplied at a gas flow rate of 50 sccm. The second reactive material may include $SiH_2Cl_2$, $SiCl_4$, $Si_2Cl_6$ or $SiH_4$ gas and may be supplied at a gas flow rate of 60 sccm. The first and second gases may be an inert gas or nitrogen ($N_2$) gas. The first and second gases may be continuously introduced into the chamber during (b) through (e). Alternatively, the first and second gases may be introduced into the chamber only during (c) and (e), respectively.

The third reactive material may be $NH_3$ or $N_2H_4$ gas and may be supplied at a gas flow rate of 500 sccm. The third reactive material may be $N_2$, $H_2$ and $NH_3$ gases and a mixture of these gases with a radical type. The third reactive material may be converted to plasma in the chamber by using an inductive coupled plasma (ICP) generation process, a direct current (DC) plasma generation process, a radio frequency (RF) plasma generation process or a microwave plasma generation process to increase a reaction rate between the first and second reactive materials and the third reactive material.

The substrate may be heated to a temperature in a range of about 400° C. to 600° C. and the chamber may maintain an internal pressure in a range of about 1 to 3 torr.

The first reactive material and the second reactive material may be supplied simultaneously to the chamber.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
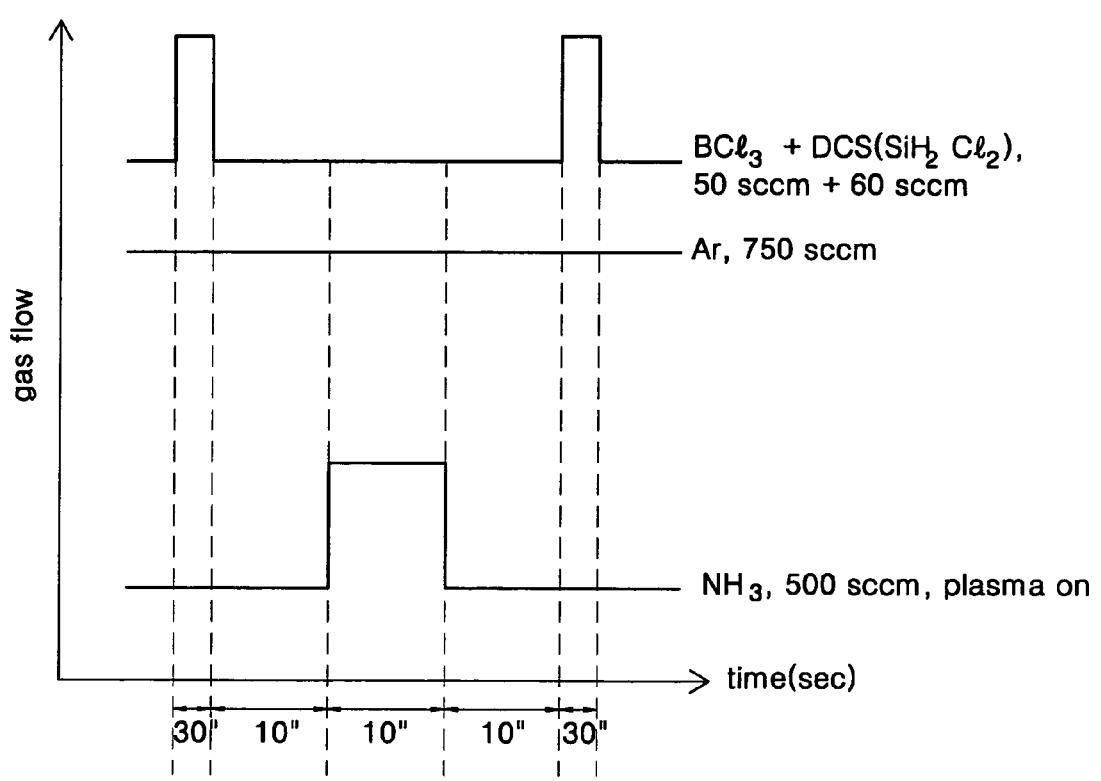
FIG. 1 is a graph showing a gas supplying sequence for forming a SiBN layer in accordance with an embodiment of the present invention.

Korean Patent Application No. 2002-11671, filed on Mar. 5, 2002, and entitled: "Method for Forming Thin Layer Using ALD," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals and characters refer to like elements throughout.

FIG. 1 is a graph showing a gas supplying sequence to form a SiBN monolayer in accordance with an embodiment of the present invention, wherein the x-axis indicates time periods for supplying gases at each step and the y-axis indicates gas flow rates.

A method for forming a SiBN thin layer according to an embodiment of the present invention will now be described with reference to FIG. 1.

First, a wafer, such as a single crystalline silicon substrate, on which a dielectric layer is to be formed is loaded in a chamber (not shown). The chamber is equipped with a pump that is used for maintaining an internal pressure of the chamber below atmospheric pressure. Then, the wafer is heated to a temperature in a range of about 200 to 750° C. and the predetermined number of depositing cycles for depositing a thin layer are proceeded. In this embodiment of the present invention, the dielectric layer deposited is a SiBN thin layer.

In a first step, a first and a second reactive material, each at a predetermined partial pressure, are supplied into the chamber for a predetermined time period, preferably 30 seconds and then they are sufficiently adsorbed onto a surface of the wafer to be saturated. At this time, the first reactive material as a source gas preferably includes $BCl_3$, $BBr_3$, $B_2H_6$ or $BF_3$. The second reactive material as a source gas preferably includes dichlorosilane (DCS, $SiH_2Cl_2$), hexa-chlorosilane (HCD, $Si_2Cl_6$), $SiCl_4$, or silane ($SiH_4$). The first and the second reactive materials are preferably supplied at gas flow rates of 50 sccm and 60 sccm, respectively.

In a second step, a first gas, preferably $N_2$ gas or an inert gas such as Ar or He, is supplied into the chamber at a flow rate of 750 sccm, thereby purging the first and second reactive materials that remain unreacted from the chamber. Therefore, partial pressures of the first and second reactive materials are lowered.

In a third step, a third reactive material, preferably $NH_3$ gas or, alternatively, a mixture of $N_2$ gas and $H_2$ gas, is introduced into the chamber at a predetermined partial pressure for a predetermined time period, preferably about 10 seconds. The third reactive material is reacted with the first reactive material and second reactive material adsorbed onto the surface of the wafer, thereby forming a SiBN mono layer including silicon (Si), boron (B) and nitrogen (N) on the surface of the wafer. The third reactive material is preferably supplied at a gas flow rate of 500 sccm. At this step, it is preferable to increase a reaction rate between the first/second reactive materials and the third reactive material by converting the third reactive material to plasma in the chamber using an inductive coupled plasma (ICP) generation process, a direct current (DC) plasma generation process, a radio frequency (RF) plasma generation process or a microwave plasma generation process. The third reactive material is preferably one of $NH_3$ gas or $N_2H_2$ gas. As the third reactive material, a mixture of $N_2$ gas and $H_2$ gas or, alternatively, $NH_3$ gas is partially or completely converted into free radicals by applications of plasma, and then the free radicals along with any remaining gases are used as the third reactive material.

In a fourth step, a second gas, preferably $N_2$ gas or an inert gas such as Ar or He, is introduced into the chamber, thereby purging the third reactive material that remains unreacted and a byproduct, such as HCl, from the chamber. The partial pressure of the second gas in the chamber is sufficiently lowered to perform this purge.

As described above, the process for depositing a SiBN monolayer includes four steps. The SiBN thin film is formed at a desired thickness by repeating this four-step cycle. In other words, the thickness of the SiBN monolayer deposited per 1 cycle by the ALD process is constant and therefore by repeating a predetermined number of times the cycle for depositing the SiBN monolayer, a SiBN thin film of a predetermined thickness may be formed.

In order to purge the gases that remain unreacted or the byproduct in the second and the fourth steps, the first and second gases, i.e., the purge gas, may be continuously introduced during the entire cycle, as shown in FIG. 1. Alternatively, the first and second gases may be introduced to the chamber only during the second and the fourth steps.

In the above-described cycle, preferably a chamber having a size of seven (7) liters is used. Further, the deposition process may be performed under a condition of a wafer temperature in a range of about 400° C. to 600° C. and an internal chamber pressure in a range of about 1 to 3 torr.

Figure 2:
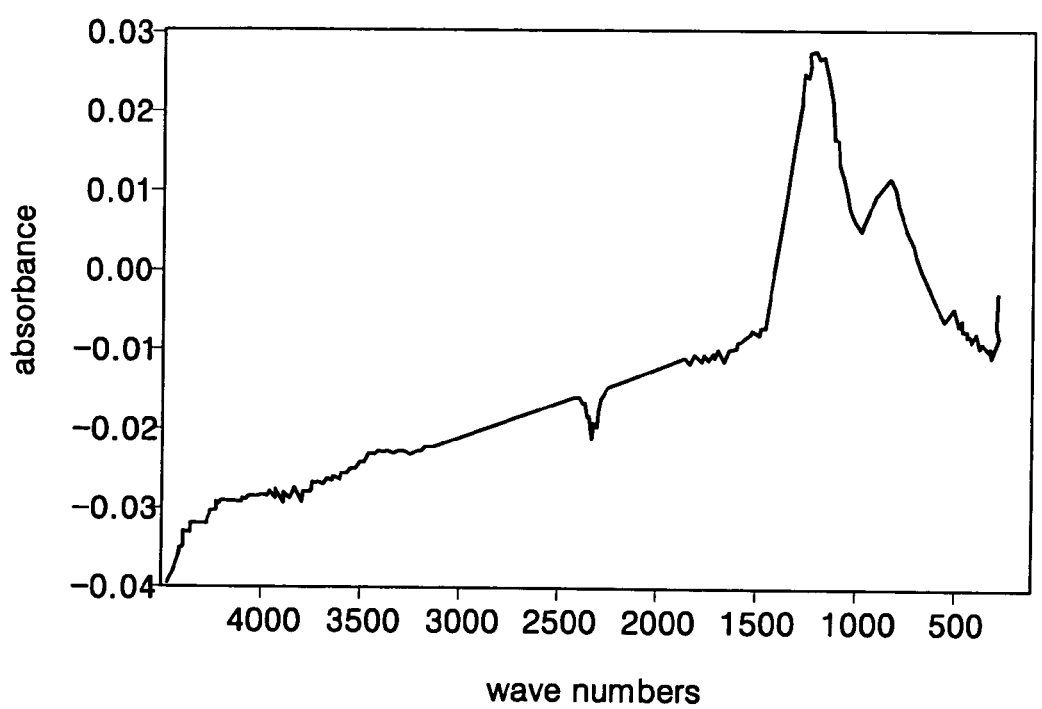
FIG. 2 is a graph showing FT-IR analysis of a SiBN layer formed in accordance with an embodiment of the present invention.

FIG. 2 illustrates a Fourier transform infrared spectroscopy (FT-IR) analysis of a SiBN thin film formed in accordance with an embodiment of the present invention. Typically, a B—N band of a conventional BN film is 1370 $cm^{-1}$ and a Si—N stretching band of a conventional $SiN_x$ film is 1860 $cm^{-1}$. As shown in FIG. 2, from the ALD SiBN thin film, a B—N band and a Si—N stretching band are observed at 1310 $cm^{-1}$ and 910 $cm^{-1}$, respectively. Accordingly, it may be seen that the ALD SiBN thin film shown in FIG. 2 is a ternary film including silicon (Si), boron (B), and nitrogen (N).

Figure 3:
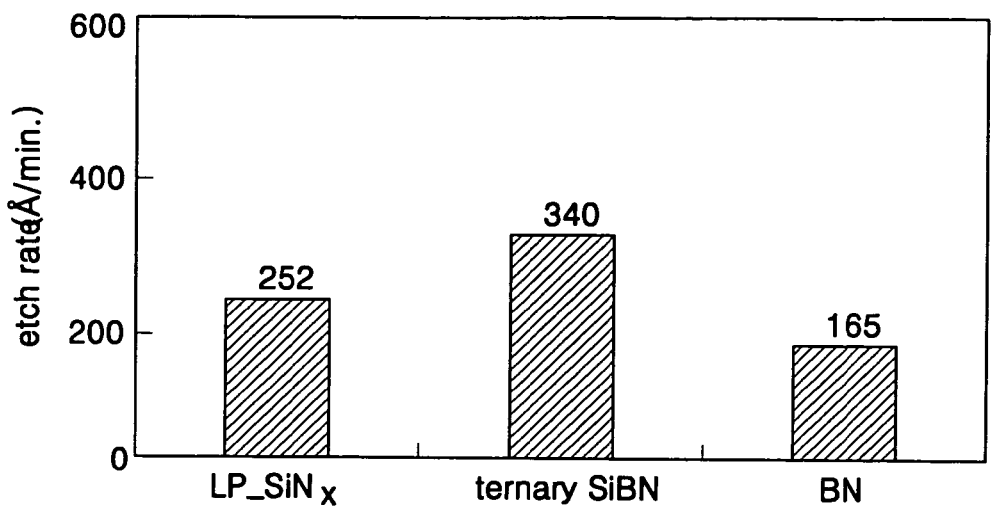
FIG. 3 is a graph showing comparative etching rates of a conventional $SiN_x$ layer formed by a LPCVD process, a SiBN layer formed in accordance with an embodiment of the present invention and a conventional BN layer in a RIE etching process.

FIG. 3 is a graph showing comparative etching rates of a conventional $SiN_x$ film formed by a LPCVD process, a SiBN film formed in accordance with an embodiment of the present invention and a conventional BN film in a RIE etching process. The SiBN film in accordance with the present invention has an excellent RIE etching characteristic under the etching condition of $C_5F_8/CH_2F_2/AR/CO/O_2$, which is even greater than the conventional $SiN_x$ film, as shown in FIG. 3.

Figure 4:
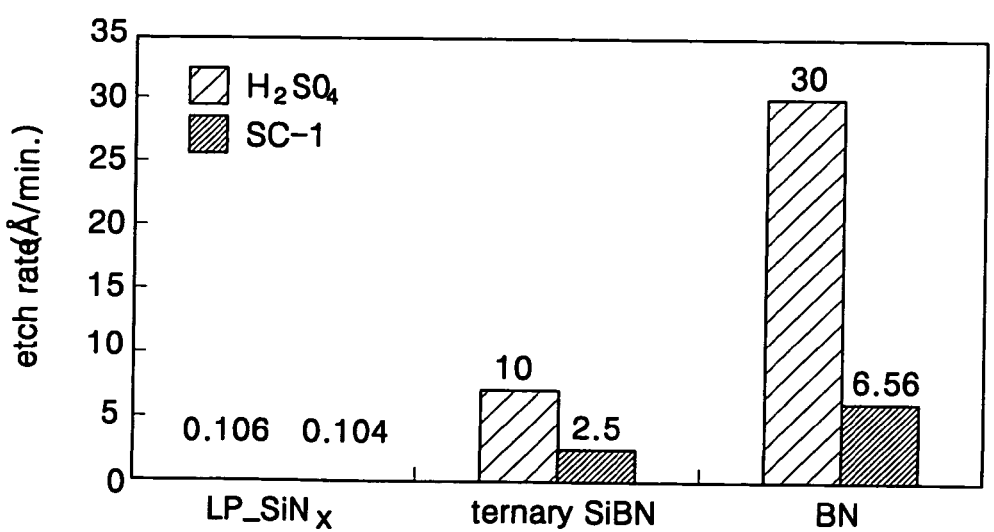
FIG. 4 is a graph showing comparative etching rates of a conventional LPCVD $SiN_x$ layer, the SiBN layer formed in accordance with an embodiment of the present invention and a conventional BN layer in a wet etching process using a high temperature wet chemical of $H_2SO_4$ or SC-1.

FIG. 4 is a graph showing comparative etching rates of a conventional $SiN_x$ film formed by a LPCVD process, a SiBN film formed in accordance with an embodiment of the present invention and a conventional BN film in a wet etching processes using a high temperature wet chemical of $H_2SO_4$ or SC1. As shown in FIG. 4, the SiBN film in accordance with the present invention shows excellent etching rate over the high temperature wet chemical, $H_2SO_4$ or SC-1, in a wet etching process.

Figure 5:
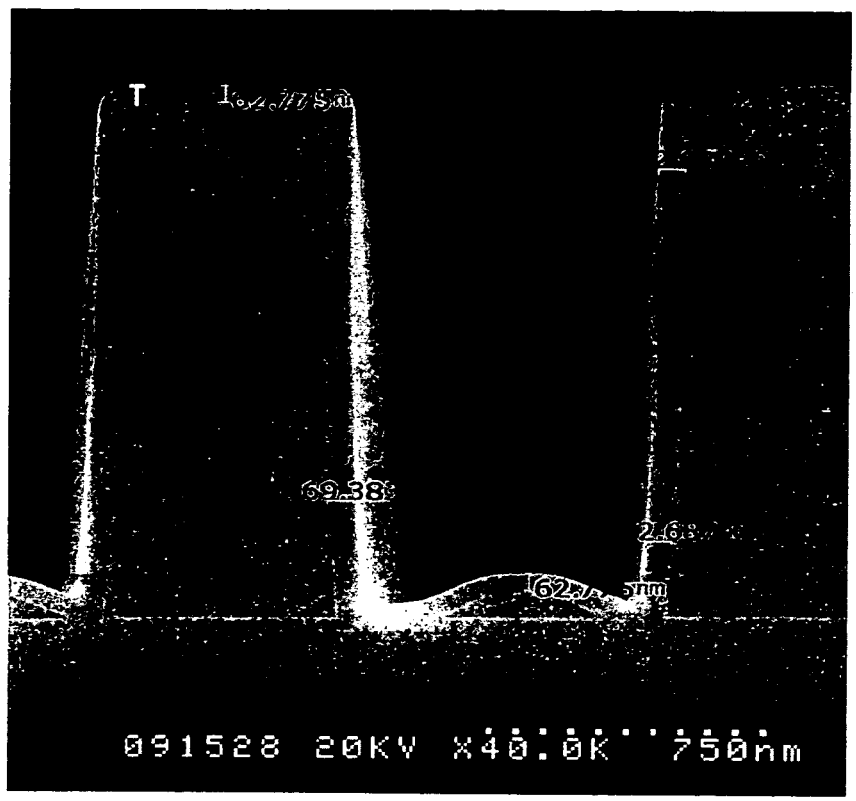
FIG. 5 is a scanning electron microscope photograph showing a step coverage of a SiBN layer formed in accordance with an embodiment of the present invention.

FIG. 5 is a scanning electron microscope photograph showing a step coverage characteristic of a SiBN film in accordance with an embodiment of the present invention. FIG. 5 shows about 95% of good step coverage.

Figure 6:
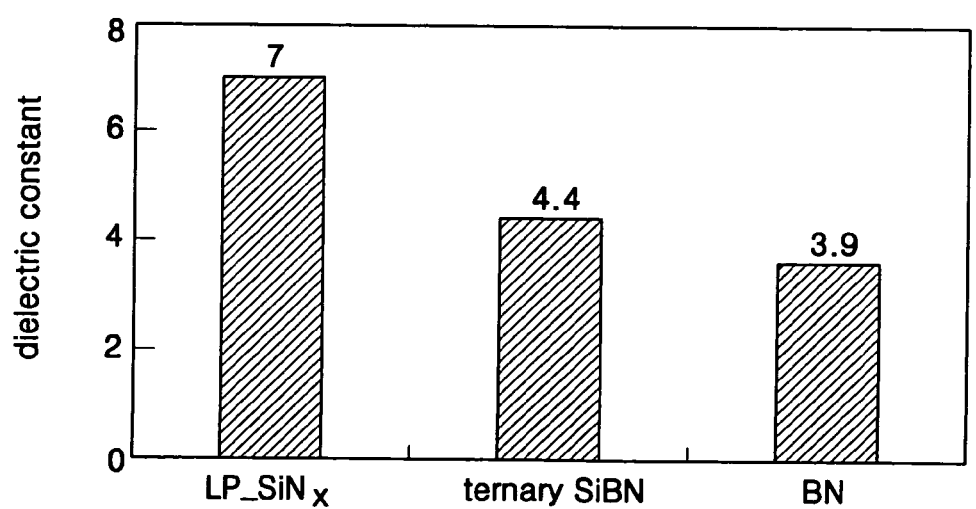
FIG. 6 is a graph comparing dielectric constants of a conventional $SiN_x$ layer formed by the LPCVD process, the ternary SiBN layer formed in accordance with an embodiment of the present invention and a conventional BN layer.

FIG. 6 is a graph comparing a dielectric constant of a ternary SiBN thin film in accordance with an embodiment of the present invention wherein the ternary SiBN thin film has a low dielectric constant of about 4.4 while a conventional SiBN film formed by a LPCVD process has a high dielectric constant of about 7.

As described above, the SiBN thin film formed by the atomic layer deposition (ALD) process in accordance with an embodiment of the present invention has improved step coverage and thickness uniformity. Further, etching rates of the SiBN thin film in accordance with the present invention are improved in the RIE etching process and the high temperature wet chemical etching process as compared to a conventional SiBN film formed by a LPCVD process. Still further, a SiBN film in accordance with the present invention has a low dielectric constant, thereby reducing the propagation delay by decreasing the parasitic capacitance.

Figure 7A:
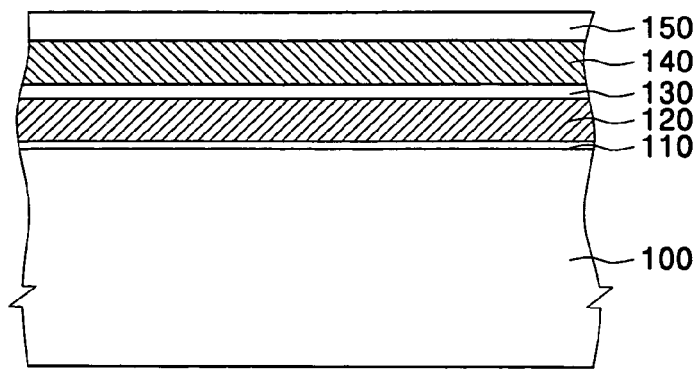
FIGS. 7A through 7C illustrate cross-sectional views of stages in a method for forming an interconnection pattern and a low-k dielectric layer for a semiconductor device in accordance with an embodiment of the present invention.
Figure 7B:
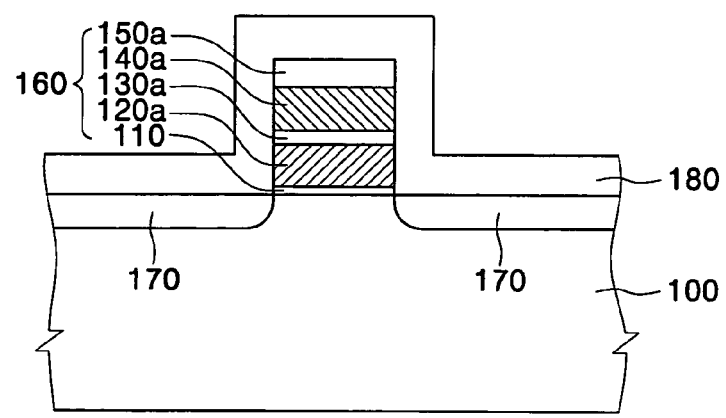
Figure 7C:
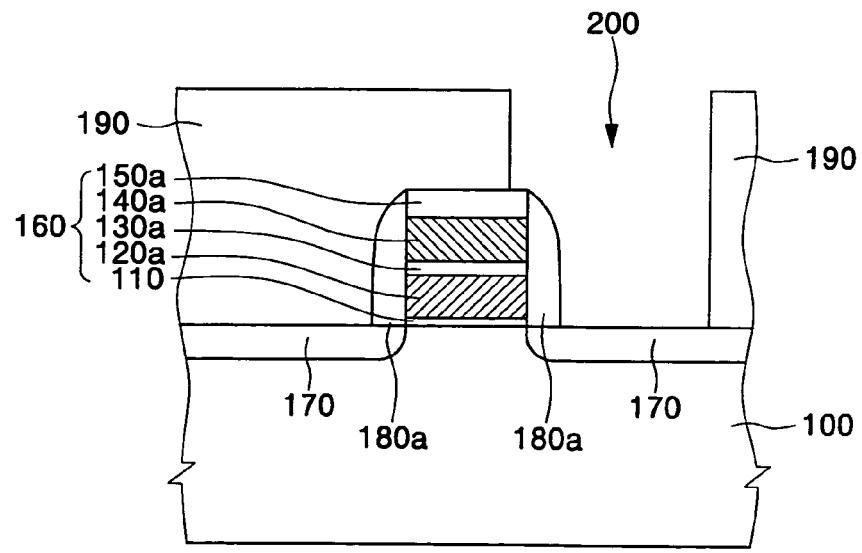

FIGS. 7A to 7C illustrate cross-sectional views of stages in a method for forming an interconnection pattern and a low-k dielectric layer for a semiconductor device in accordance with an embodiment of the present invention.

In accordance with other embodiments of the present invention, the low-k dielectric layers may be formed for nonvolatile semiconductor devices such as a floating gate.

Referring to FIG. 7A, a tunnel insulating layer 110 and a floating gate conducting layer (not shown) are sequentially formed on an entire surface of a semiconductor substrate 100 having an active area thereon. A pre-floating gate 120 is formed by sequentially patterning the floating gate conducting layer and the tunnel insulating layer 110. The tunnel insulating layer 110 may be formed of a silicon oxide layer, in particular, a thermal oxidation layer. The pre-floating gate 120 may be formed of a doped polysilicon layer as a conducting layer.

A gate interlayer dielectric layer 130, a control gate conducting layer 140, and a hardmask layer 150 are sequentially formed on the entire surface of the substrate 100 having the pre-floating gate 120 thereon. The gate interlayer dielectric layer 130 may be formed of a silicon oxide layer, in particular, a CVD silicon oxidation layer. The control gate conducting layer 140 may be formed of a doped polysilicon layer, a polycide layer, or a metal layer.

Referring to FIG. 7B, the hardmask layer 150, the control gate conducting layer 140, the gate interlayer dielectric layer 130, the pre-floating gate 120, and the tunnel insulating layer 110 are sequentially patterned in order to form a gate pattern 160. The gate pattern 160 includes a hardmask layer pattern 150a, a gate electrode 140a, i.e., a control gate, a gate interlayer dielectric layer pattern 130a, a floating gate 120a, and the tunnel insulating layer 110 stacked sequentially on the substrate 100, thereby forming an interconnection pattern. A source/drain region 170 is then formed by implanting impurity ions in the active area of the substrate 100 using the gate pattern 160 as a mask.

A low-k dielectric layer 180, in particular, a SiBN ternary layer, is formed conformably on the entire surface of the substrate 100 having the gate pattern 160 thereon by the above explained processes, including the first step process through the fourth step process. The SiBN ternary layer is formed to a predetermined thickness on the substrate by repeating the first step process through the fourth step process for forming the monolayer a predetermined number of times.

Referring to FIG. 7C, spacers 180a are formed on both sidewalls of the gate pattern 160 by anisotropically etching the low-k dielectric layer 180.

The hardmask layer pattern 150a may be formed of the same material layer as that of the spacers 180a, for example, the SiBN ternary layer.

An interlayer insulating layer 190 is formed on the entire surface of the substrate 100 having the spacers 180a thereon. A contact hole 200 may be self-aligned with the spacers 180a to expose the source/drain region 170 by patterning the interlayer insulating layer 190. The contact hole 200 may be filled with a conducting material.

In accordance with other embodiments of the present invention, the low-k dielectric layers may be formed for a DRAM semiconductor device. For example, gate spacers and a bit line or bit line contact spacers in a DRAM device may be formed of the low-k dielectric layers, i.e., the SiBN layers.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for forming a low-k dielectric layer for a semiconductor device using an atomic layer deposition (ALD) process, comprising:
   (a) forming predetermined interconnection patterns on a semiconductor substrate;
   (b) supplying a first reactive material and a second reactive material to a chamber having the substrate therein, thereby adsorbing the first reactive material and the second reactive material on a surface of the substrate;
   (c) supplying a first gas to the chamber to purge the first reactive material and the second reactive material that remain unreacted;
   (d) supplying a third reactive material to the chamber, thereby causing a reaction between the first and second materials and the third reactive material to form a monolayer;
   (e) supplying a second gas to the chamber to purge the third reactive material that remains unreacted in the chamber and a byproduct; and
   (f) repeating (b) through (e) for forming the monolayer a predetermined number of times to form a SiBN ternary layer having a predetermined thickness on the substrate.

2. The method according to claim 1, wherein forming the predetermined interconnection patterns on the substrate comprises:
   forming a tunnel insulating layer on the substrate; and
   sequentially forming a floating gate, a gate interlayer dielectric layer, and a control gate on the tunnel insulating layer.

3. The method according to claim 1, wherein forming the predetermined interconnection patterns on the substrate comprises forming a bit line.

4. The method according to claim 1, further comprising etching the SiBN ternary layer to form spacers on sidewalls of the floating gate and the control gate.

5. The method according to claim 1, wherein the first reactive material includes $BCl_3$, $BBr_3$, $B_2H_6$ or $BF_3$ gas.

6. The method according to claim 1, wherein the first reactive material is supplied at a gas flow rate of 50 sccm.

7. The method according to claim 1, wherein the second reactive material includes $SiH_2Cl_2$, $SiCl_4$, $Si_2Cl_6$ or $SiH_4$ gas.

8. The method according to claim 1, wherein the second reactive material is supplied at a gas flow rate of 60 sccm.

9. The method according to claim 1, wherein the first and second gases are an inert gas or nitrogen ($N_2$) gas.

10. The method according to claim 1, wherein the first and second gases are continuously introduced into the chamber during (b) through (e).

11. The method according to claim 1, wherein the first and second gases are introduced into the chamber only during (c) and (e), respectively.

12. The method according to claim 1, wherein the third reactive material is $NH_3$ or $N_2H_4$ gas.

13. The method according to claim 1, wherein the third reactive material is supplied at a gas flow rate of 500 sccm.

14. The method according to claim 1, wherein the third reactive material is $N_2$, $H_2$ and $NH_3$ gases and a mixture of these gases with a radical type.

15. The method according to claim 1, wherein the third reactive material is converted to plasma in the chamber by using an inductive coupled plasma (ICP) generation process, a direct current (DC) plasma generation process, a radio frequency (RF) plasma generation process or a microwave plasma generation process to increase a reaction rate between the first and second reactive materials and the third reactive material.

16. The method according to claim 1, wherein the substrate is heated to a temperature in a range of about 400° C. to 600° C. and the chamber maintains an internal pressure in a range of about 1 to 3 torr.

17. The method according to claim 1, wherein the first reactive material and the second reactive material are supplied simultaneously to the chamber.

* * * * *